United States Patent
Pozder et al.

(10) Patent No.: US 6,951,801 B2
(45) Date of Patent: Oct. 4, 2005

(54) METAL REDUCTION IN WAFER SCRIBE AREA

(75) Inventors: Scott K. Pozder, Austin, TX (US); Trent S. Uehling, New Braunfels, TX (US); Lakshmi N. Ramanathan, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 45 days.

(21) Appl. No.: 10/351,798

(22) Filed: Jan. 27, 2003

(65) Prior Publication Data

US 2004/0147097 A1 Jul. 29, 2004

(51) Int. Cl.[7] .............................................. H01L 21/301
(52) U.S. Cl. ........................ 438/462; 438/460; 438/110
(58) Field of Search ................................. 438/460, 462, 438/106, 110, 113, 618

(56) References Cited

U.S. PATENT DOCUMENTS

| | | | |
|---|---|---|---|
| 6,271,578 B1 | * | 8/2001 | Mitwalsky et al. ......... 257/620 |
| 6,362,524 B1 | | 3/2002 | Blish et al. |
| 2003/0197289 A1 | * | 10/2003 | Lin ............................ 257/786 |
| 2004/0219766 A1 | * | 11/2004 | Headley et al. ............. 438/460 |

OTHER PUBLICATIONS

"Construction Analysis, IBM PowerPC 750 RISC Microprocessor (Copper) with TEM Analysis," Report Number SCA 9808–587, Integrated Circuit Engineering, Scottsdale, Arizona.

* cited by examiner

*Primary Examiner*—Brad Smith
(74) *Attorney, Agent, or Firm*—David G. Dolezal; Robert L. King

(57) ABSTRACT

A process for removing metal from a scribe area of a semiconductor wafer. The metal removed may include exposed metal in a saw path of the scribe area and the metal in a crack stop trench of the scribe area. In one example, copper is removed from the scribe area by wet etching the wafer. In one example, the wet etching process is performed after the removal of an exposed barrier adhesion layer on the wafer surface. Removal of the metal in the saw path may reduce the amount of metal buildup on a saw blade during singulation of the die areas of a wafer.

24 Claims, 9 Drawing Sheets

METAL REDUCTION IN WAFER SCRIBE AREA

BACKGROUND OF THE INVENTION

1. Field of the Invention

This invention relates in general to the manufacture of semiconductor devices and in particular to the reduction of metal in a scribe area between semiconductor die areas of a wafer.

2. Description of the Related Art

Copper is used in scribe area interconnect layers of a semiconductor wafer e.g. for test structures and alignment keys. During the singulation of the die areas of a wafer, the copper in the scribe area interconnect layer may build up on a saw blade. This copper build up on the saw blade causes cracking and chipping of the wafer. The cracks and chips may lead to a mechanical failure of the die during its application.

Multiple saw blades may be used for cutting a scribe area to reduce the damage to the substrate of the wafer from the copper buildup on a saw blade. A first saw blade would be used to cut the interconnect layer. Copper build up from the interconnect layer would accumulate on the first saw blade. A second saw blade would follow the same saw path to cut the under laying substrate. Because this second saw blade would not be cutting any copper, little if any copper would build up on this saw blade. However, utilizing two saw blades may cause other problems due to saw misalignment. Also, ledges in the die edge may be created due to the copper build up on the first saw blade in that the saw blade with copper build up may be wider than the second saw blade.

Crack stop trenches located at the die edge may be used to prevent cracking of the die. However, these trenches may require additional processes for patterning, etching of the pattern, removal of the mask, and etching. Furthermore, cracks may propagate beneath the trench into the active area of the die. In addition, with the use of low density dielectric materials having a low dielectric constant in the interconnect layer, trenches in the die may open the die to moisture. Accordingly, it is desirable to reduce the cause of cracking in wafer fabrication.

What is needed is an improved method for reducing the amount of copper or other metals in the saw path to prevent the accumulation of metal on a saw blade or other type of wafer cutting device so as to reduce cracking, chipping, or other damage to the wafer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
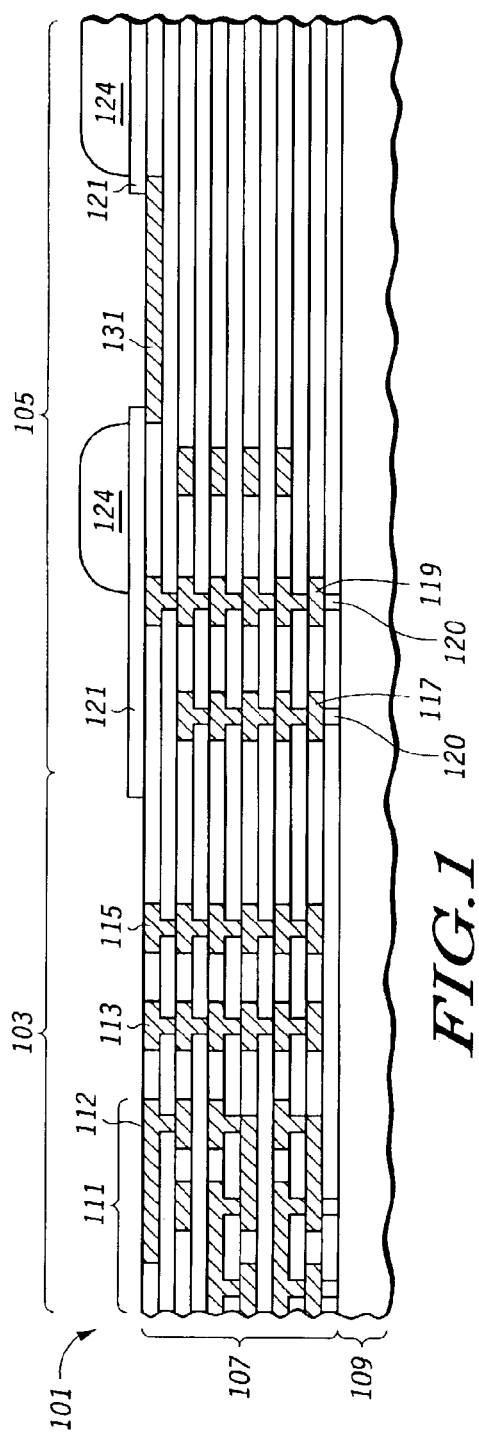
FIG. 1 is a partial cross sectional view of one embodiment of a semiconductor wafer at a stage during its manufacture according to the present invention.

FIG. 1 is a partial cross sectional view of one embodiment of a semiconductor wafer during its manufacture according to the present invention. FIG. 1 shows a portion of a wafer 101 prior to the formation of solder balls (or the formation of other die-to-package external conductive connection structures in other embodiments). Die area 105 of wafer 101 is a portion of wafer 101 from which a semiconductor die (not shown) is made. Wafer 101 includes multiple die areas (not shown) separated by scribe areas (not shown). FIG. 1 shows a portion of scribe area 103 located adjacent to die area 105. A second die area (not shown) is located to the left of scribe area 103, relative to the view shown in FIG. 1. In one embodiment, a die made from die area 105 is utilized in a flip chip configuration in a semiconductor package.

Wafer 101 includes an interconnect stack layer 107 located on top of substrate 109. In FIG. 1, stack layer 107 includes multiple layers of dielectric material and interconnecting electrical conductive structures such as vias and trace layers. These interconnecting electrically conductive structures are made of metal (e.g. copper, aluminum, silver, or gold) and electrically couple devices (not shown) formed in substrate 109 with external conductive connection structures such as e.g. solder balls. The multiple layers of interconnect stack layer 107 are, in one embodiment, formed by a dual inlaid process, but may, in other embodiments, be formed by other processes such as e.g. a single inlaid process.

To singulate the die of a wafer, a saw blade or other cutting device is used to separate the die areas (e.g. 105) from each other during the later stages of manufacture (see FIG. 9). In FIG. 1, a saw blade cuts the wafer at a saw path 111. Conductive structures 112 which are made of copper in one embodiment, are located in saw path 111. These conductive structures are utilized for testing and alignment guides during manufacture but typically are not electrically coupled to the devices formed in the substrate 109 of die area 105 and are not utilized during the operation of a die in its end use.

During the singulation of the die, the copper of these conductive structures 112 in the saw path 111 may build up on the saw blade thereby causing problems during singulation. As will be described later, portions of the metal in the saw path 111 are removed to reduce the metal buildup on a saw blade.

A passivation layer 121 is located on interconnect layer 107. Passivation layer 121 is made of a dielectric passivation material such as e.g. silicon nitride. Passivation layer 121 is formed over the die areas e.g. 105 of wafer 101 and is utilize as a protective layer of the die area. Passivation layer 121 includes openings for coupling external conductive connection structures (e.g. solder balls) to electrically conductive pads (e.g. 131) in interconnect stack layer 107. In the embodiment shown, a polyimide layer 124 is formed over die area 105 and is utilized for stress relief and die protection. Polyimide layer 124 includes openings for coupling external conductive connection structures (e.g. solder balls) to electrically conductive pads (e.g. 131) in interconnect stack layer 107. In some embodiments, passivation layer 121 may be located over portions of the scribe area that do not include metals in the saw path that are to be removed.

An edge seal ring 119 and crack stop ring 117 extend around the perimeter of die area 105. Theses structures are made of metal traces with trench vias located in between the traces. The contact vias 120 of the seal ring 119 and crack stop ring 117 may be may of a different material such as tungsten.

Conductive structures 113 and 115 are ring structures located on the edge of saw path 111 in stack layer 107 and surround die area 105. In one embodiment where the saw blade is 50 microns wide and the scribe area is 100 microns wide, structures 113 and 115 are located 20 and 15 microns, respectively, from crack stop 117. As will be shown, in later processes, conductive structures 113 and 115 are removed to form crack stop trenches in the scribe area.

Figure 2:
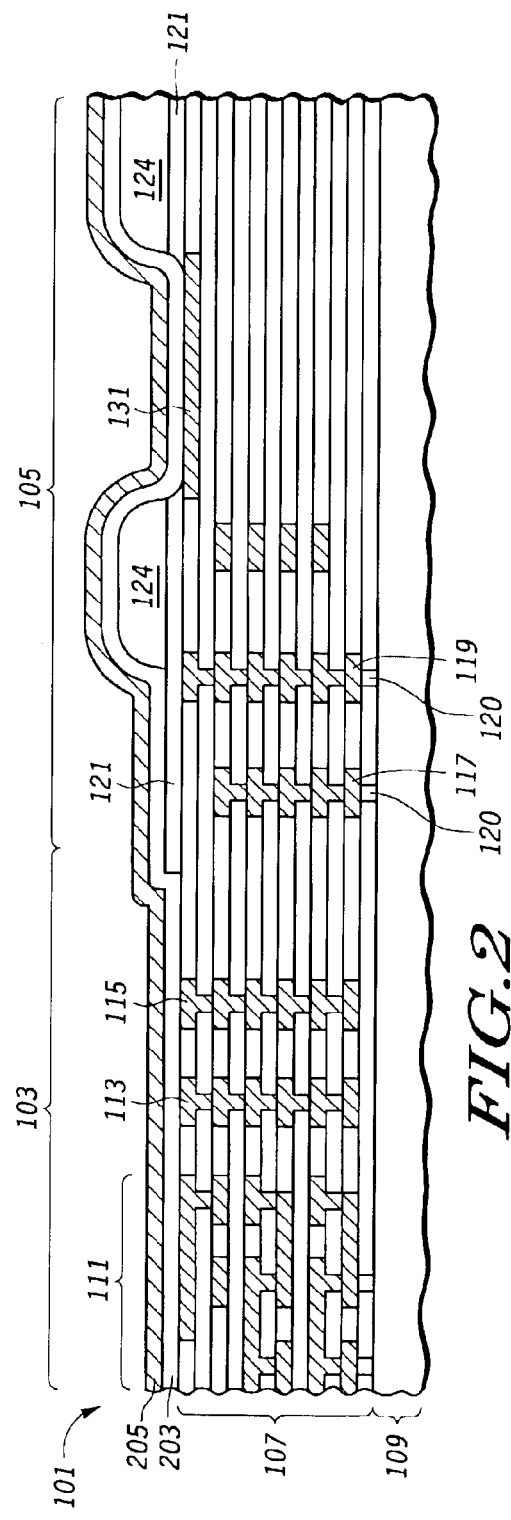
FIG. 2 is a partial cross sectional view of one embodiment of a semiconductor wafer at another stage during its manufacture according to the present invention.

FIG. 2 shows a partial cross sectional view of a portion of wafer 101 after the application of a barrier adhesion layer 203 and a electrical bus layer 205 on barrier adhesion layer 203. In one embodiment, layer 203 is a layer of titanium tungsten (TiW) formed by a physical vapor deposition process and is 2700 Angstroms. In other embodiments, layer 203 may include nickel. Still in other embodiments, layer 203 may be a layer of titanium nitride (TiN), tantalum (Ta), nickel (N), or tungsten (W). Layer 205 includes copper and is also applied, in one embodiment, over the entire wafer by a physical vapor deposition process. In other embodiments, layer 205 may be applied by other processes such as e.g. electroless plating or chemical vapor deposition. Layer 205 acts as an electrical bus for further electroplating for forming other structures such as copper stud 307 (see FIG. 3). In one embodiment, layer 205 is 5300 angstroms thick.

Figure 3:
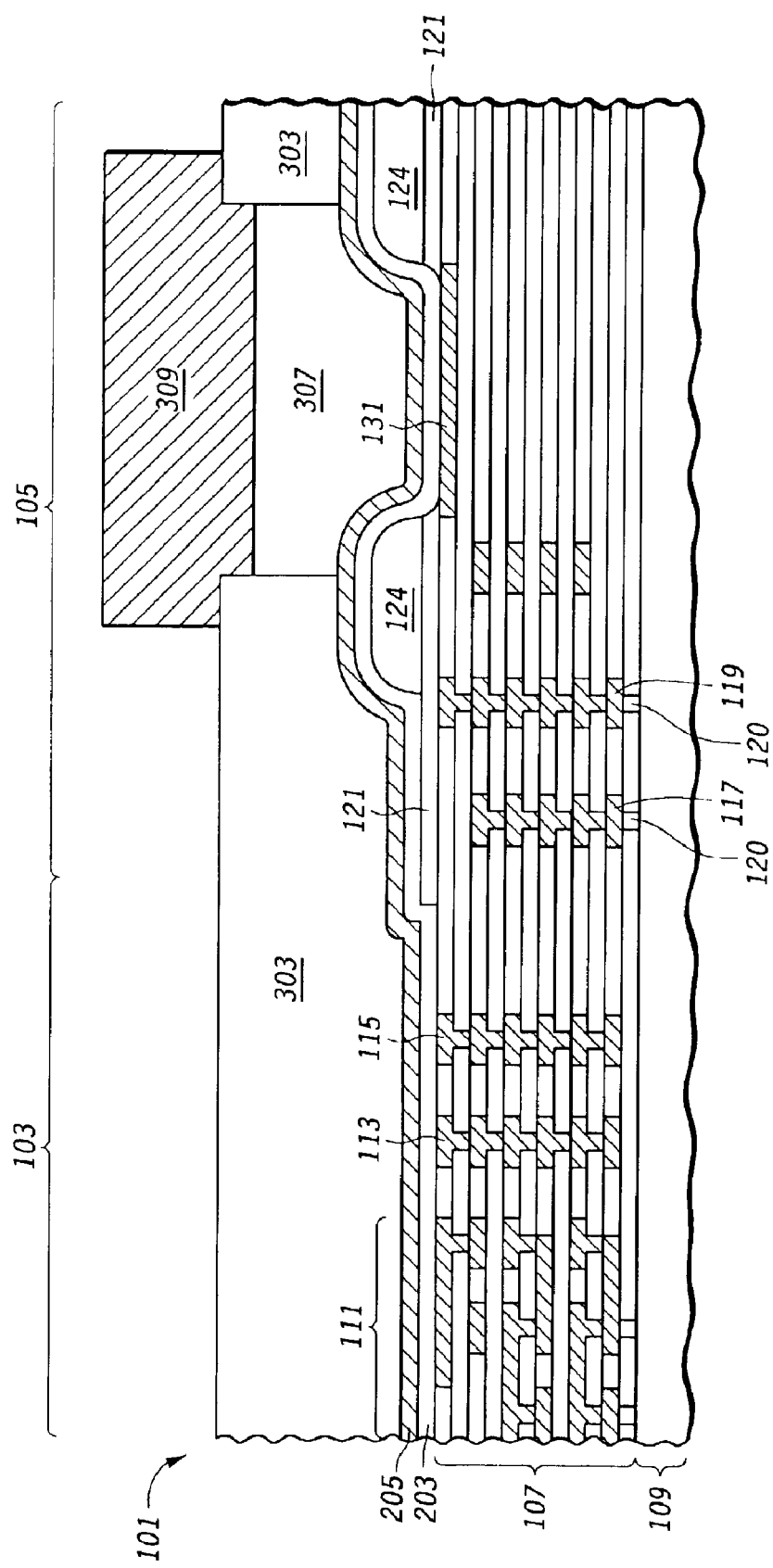
FIG. 3 is a partial cross sectional view of one embodiment of a semiconductor wafer at another stage during its manufacture according to the present invention.

FIG. 3 shows a partial cross sectional view of a portion of wafer 101 after the formation of copper studs (e.g. 307) and solder caps (e.g. 309) for forming external conductive connection structures for externally coupling the devices of a die in substrate 109. A photo resist layer 303 is first patterned on layer 205 having openings exposing layer 205 at locations over the conductive pads (e.g. 131). Copper studs (e.g. 307) are then formed in the openings of the photo resist by electroplating. Afterwards, solder caps (e.g. 309) are also formed by electroplating.

Figure 4:
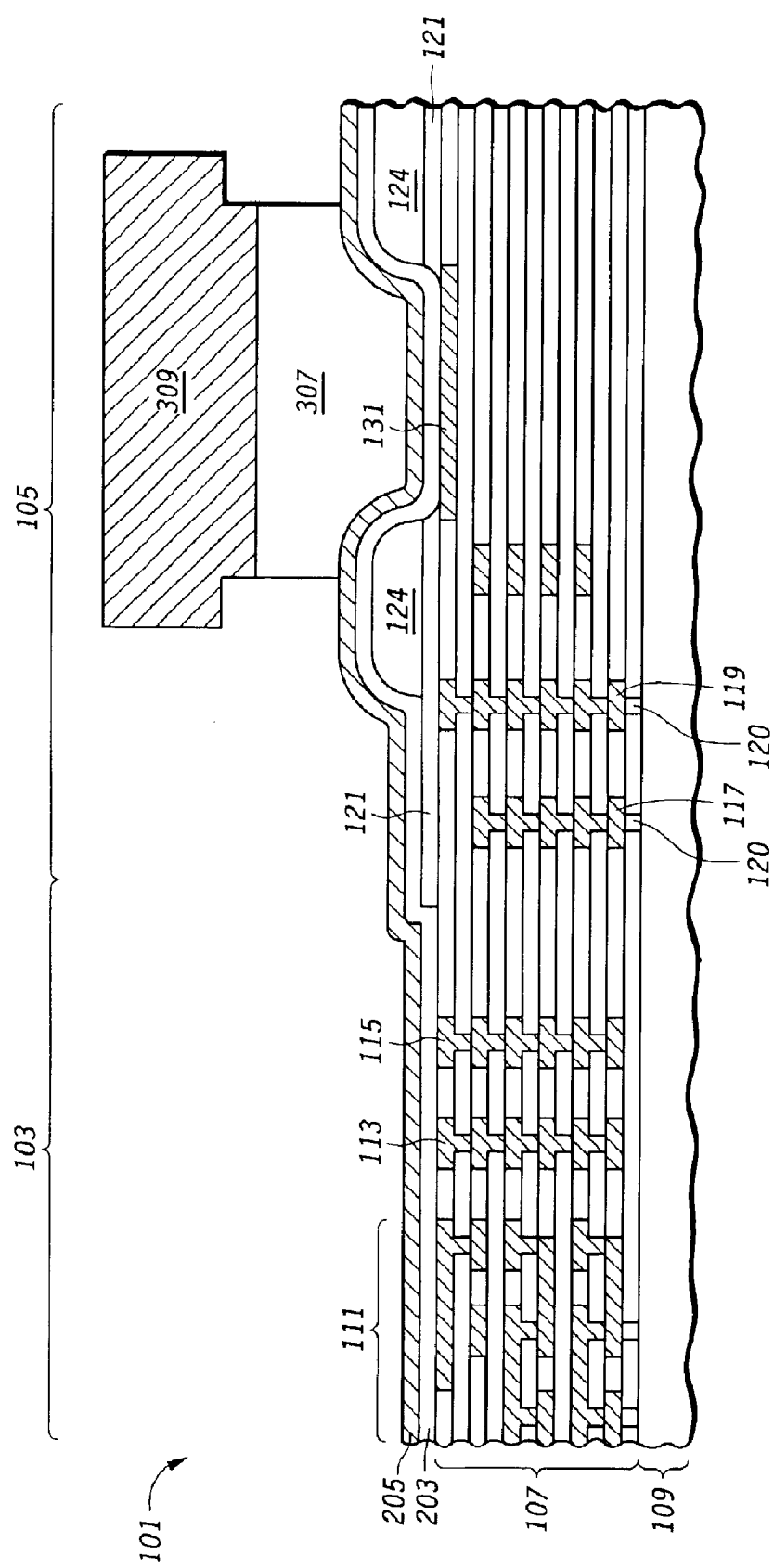
FIG. 4 is a partial cross sectional view of one embodiment of a semiconductor wafer at another stage during its manufacture according to the present invention.

FIG. 4 shows a partial cross sectional view of a portion of wafer 101 where photo resist 303 has been removed. After removal of the photo resist 303, the surface of the wafer is then wet etched to selectively remove copper layer 205. In one embodiment, the wet etch is performed using an ammonical enchant such as METEX FA and METEX FB sold by the MACDERMID CORPORATION of Connecticut. Also removed during this process are a portion of the side walls of the copper studs (e.g. 307). The portion of the sidewalls removed has a width that is approximately the same as the thickness of layer 205.

Figure 5:
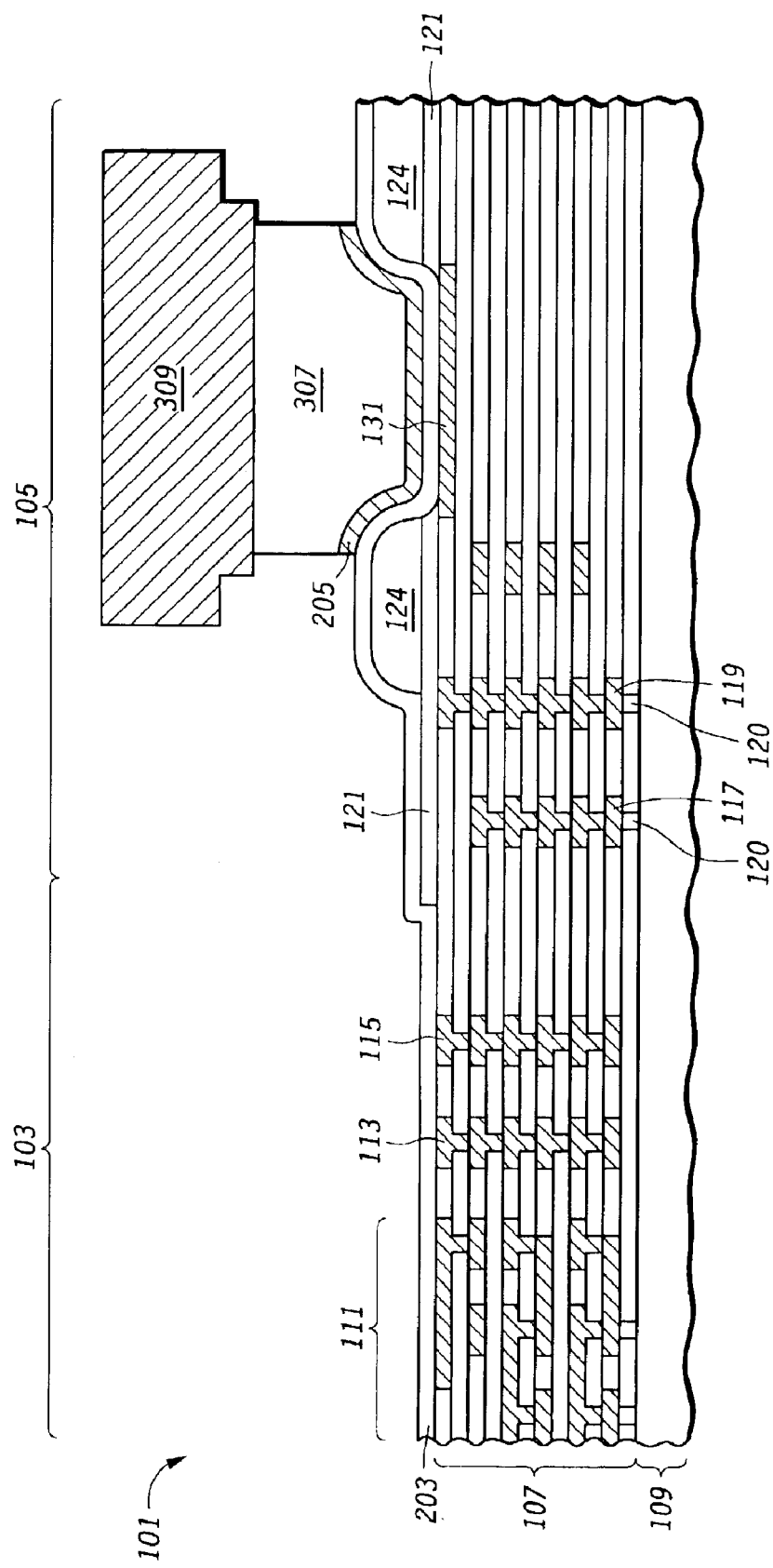
FIG. 5 is a partial cross sectional view of one embodiment of a semiconductor wafer at another stage during its manufacture according to the present invention.

FIG. 5 shows a partial cross sectional view of a portion of wafer 101 after the removal of layer 205. The portion of layer 203 not under a stud (307) is then removed in a chemical bath e.g. using hydrogen peroxide. The resulting structure is shown in FIG. 6.

Figure 6:
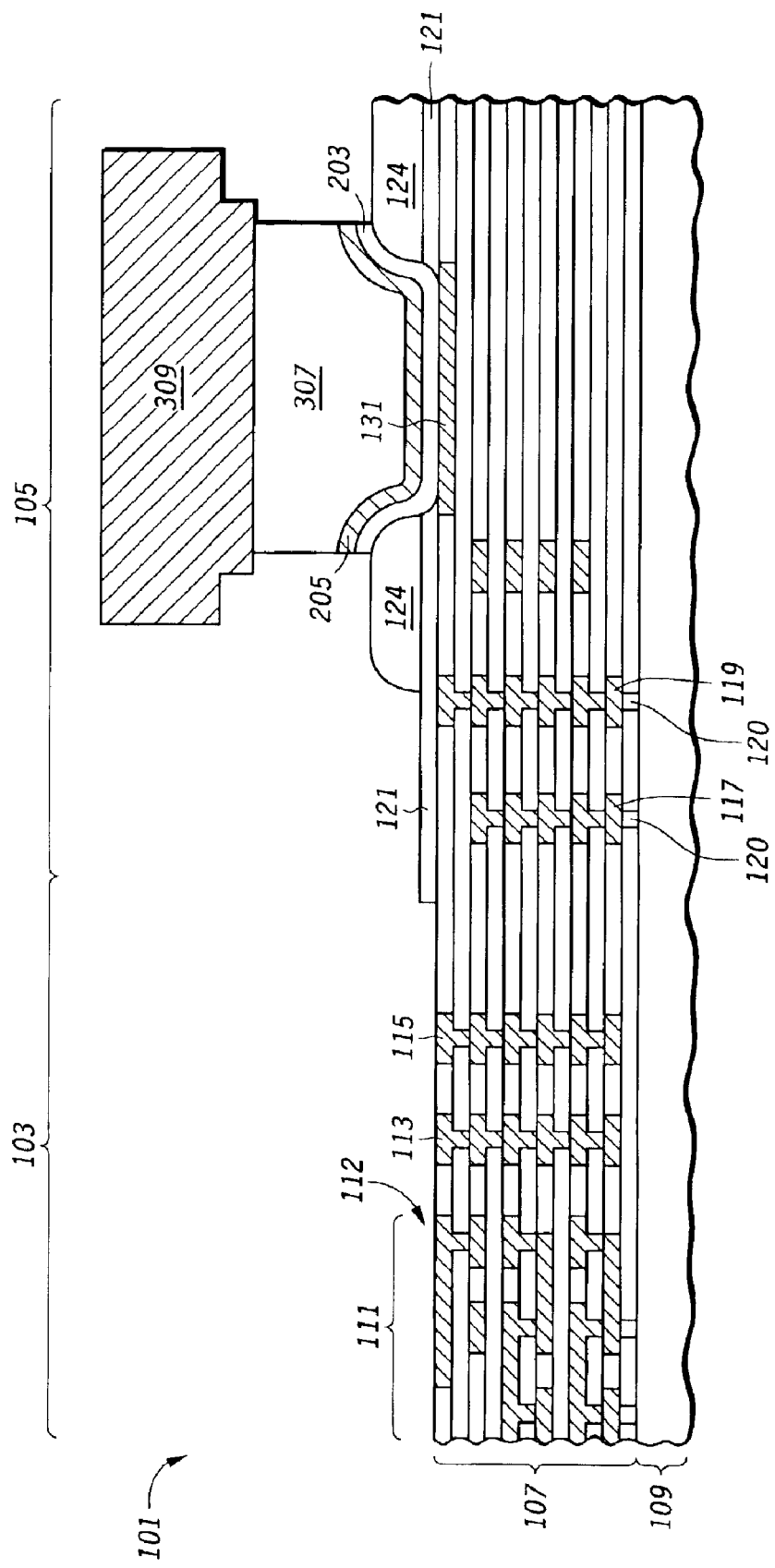
FIG. 6 is a partial cross sectional view of one embodiment of a semiconductor wafer at another stage during its manufacture according to the present invention.

FIG. 6 shows a partial cross sectional view of wafer 101 after the removal of portions of layer 203. After the removal of portions of layer 203, portions of stack layer 107 not located under passivation layer 121 and/or solder cap 309 are exposed. At this time, wafer 101 is then wet etched to remove exposed copper in test structure 112 and in conductive structures 113 and 115. The resultant structure from this wet etch process is shown in FIG. 7.

Figure 7:
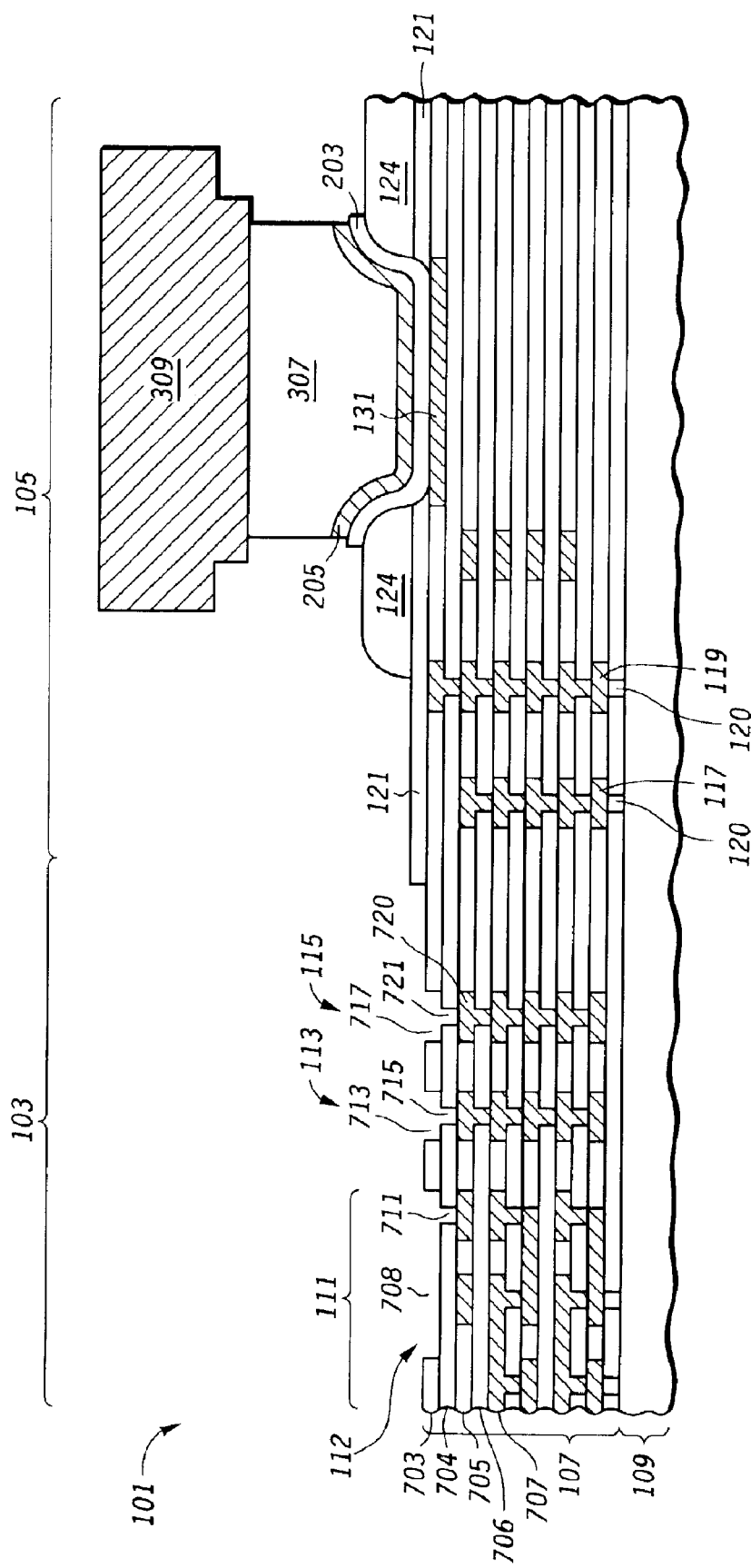
FIG. 7 is a partial cross sectional view of one embodiment of a semiconductor wafer at another stage during its manufacture according to the present invention.

As shown in FIG. 7, the exposed copper of test structure 112, conductive structure 113 and conductive structure 115 in top interconnect layer 703 have been removed by the wet etch process to leave openings 708, 713, and 717, respectively. Because interconnect layer 107 was formed with a dual inlaid process, the copper in vias 711, 715, and 721 of layer 704 are also removed. In the embodiment shown, the copper of test structure 112, conductive structure 113, and conductive structure 115 in stack layer 705 are not removed in that there is a conductive barrier adhesion layer (not shown) located between the conductive structures (shown as removed in FIG. 7) of via stack layer 704 and the conductive structures (e.g. 720) in stack layer 705. The barrier adhesion layer includes at least one of titanium, tantalum, and tungsten.

The wet etch of the exposed metal in stack layers 703 and 704 also removes copper from the sidewalls of the copper studs (e.g. 307) and the copper layer 205 located underneath, exposing a portion of the top of layer 203 and a portion of the bottom of solder cap 309. Furthermore, the ammonium ions of the wet etch used to remove the exposed metal in stack layers 703 and 704 may also remove complex trace amounts of lead located on exposed passivation layer 121 and polyimide layer 124.

After the wet etch to remove exposed metal in stack layers 703 and 704, wafer 101 is subjected to another chemical bath using e.g. hydrogen peroxide to remove the barrier adhesion layer (not shown) on the conductive metal (e.g.

720) of stack layer 705. This bath also removes a portion of layer 203 that is exposed. Afterwards, wafer 101 is subjected to another wet etch process to remove the exposed copper e.g. 720 in stack layers 705 and 706. By repeating the process of a chemical bath to remove the conductive barrier adhesion layer followed by wet etch to remove the exposed copper in the next two stack layers, all of the copper of conductive structures 113 and 115, as well as any exposed copper in saw path 111, can be removed.

Figure 8:
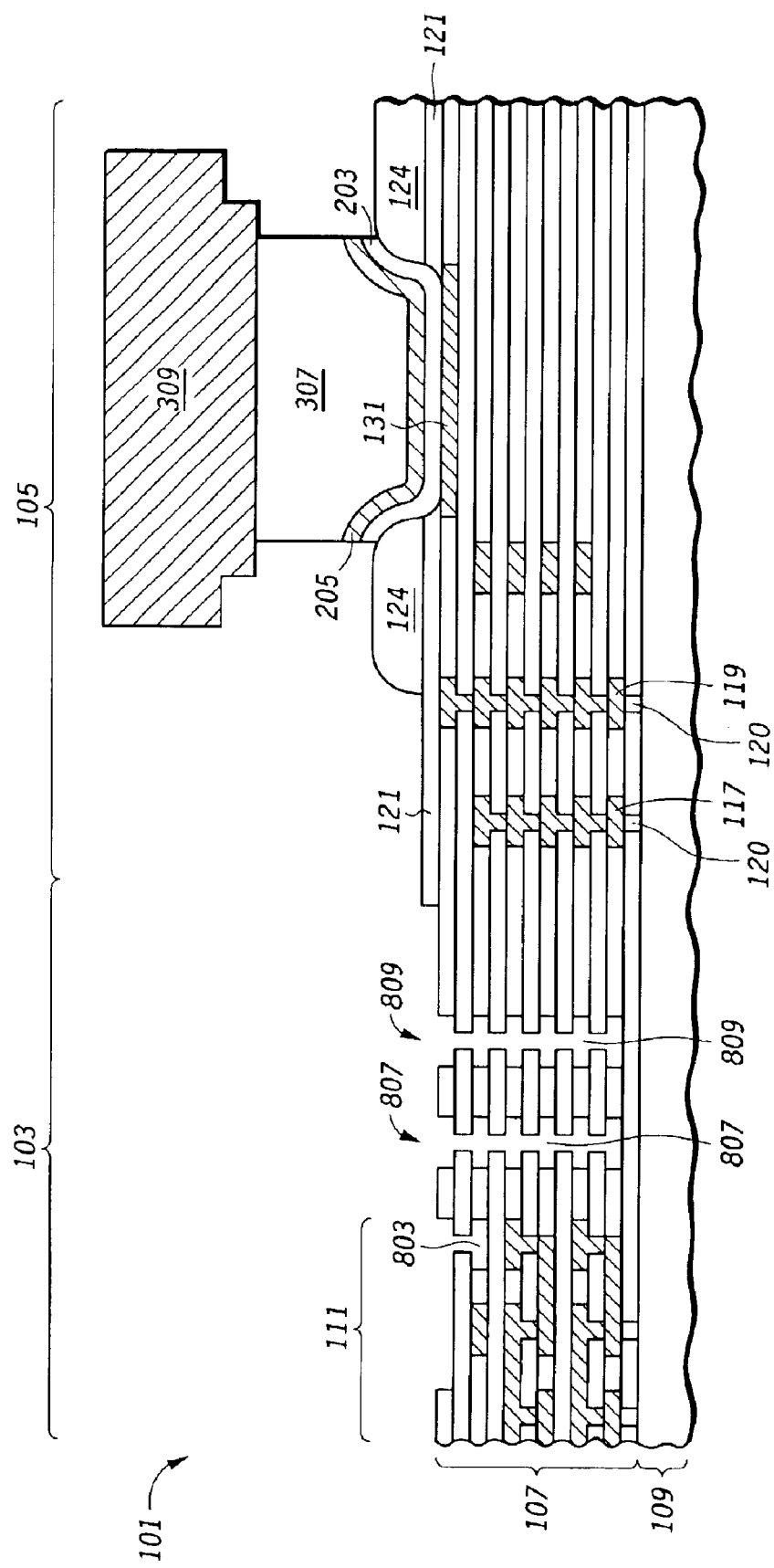
FIG. 8 is a partial cross sectional view of one embodiment of a semiconductor wafer at another stage during its manufacture according to the present invention.

FIG. 8 shows a partial cross sectional view of wafer 101 where all of the copper of conductive structures 113 and 115 have been removed to form crack stop trenches 807 and 809, respectively. The exposed copper in saw path 111 has been removed as well. Although there may be copper located in lower levels of the saw path 111, the copper in the lower stack layers in some embodiments, may not generate build up on the saw in that the amount of copper in the saw blade path at layer 703 is greater than at the lower levels because the metal traces are narrower at the lower levels and are a smaller fraction of the saw blade width.

During the repeated chemical bath and wet etch processes, the diameter of the copper stud (e.g. 307) as well as the exposed portions of layers 205 and 203 are reduced.

Figure 9:
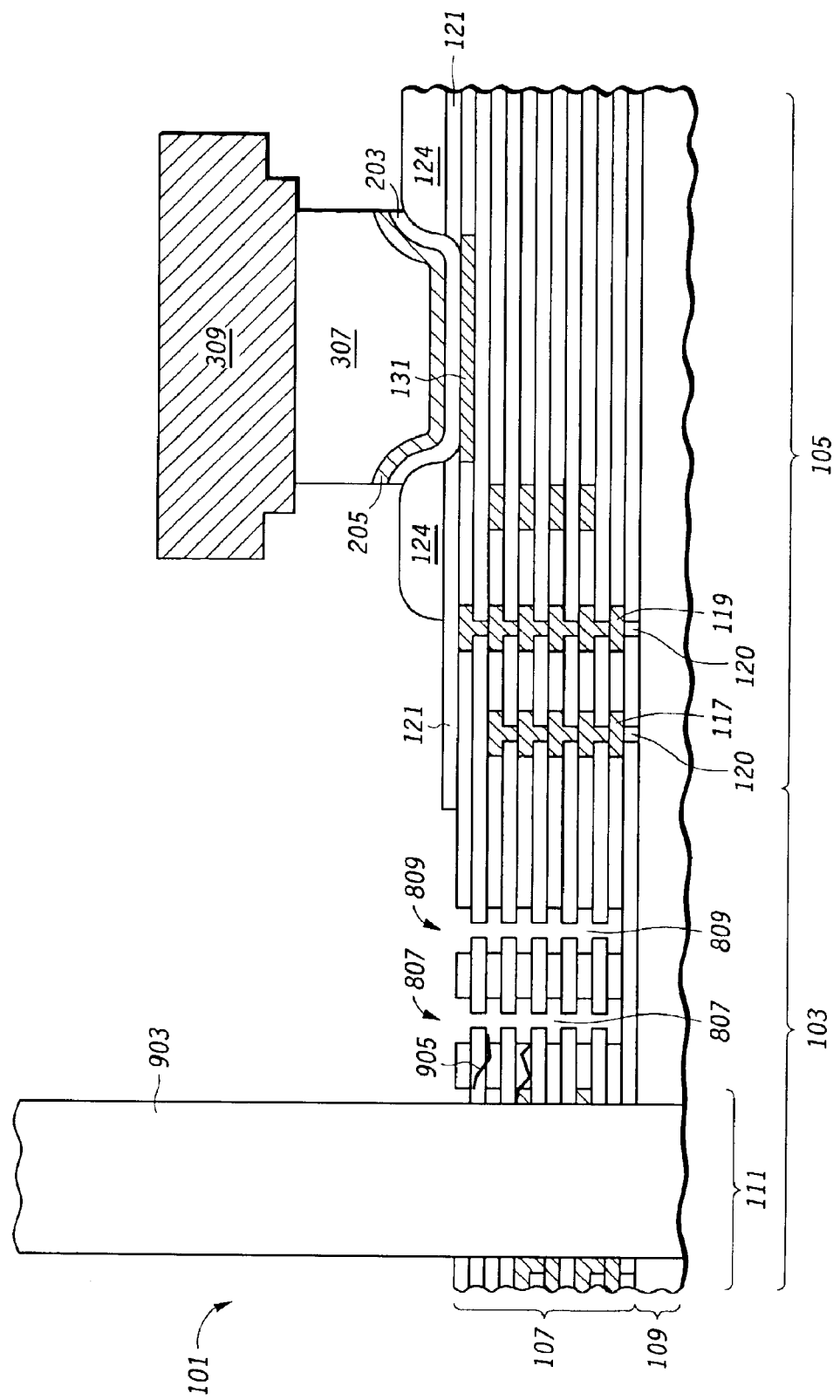
FIG. 9 is a partial cross sectional view of one embodiment of a semiconductor wafer at another stage during its manufacture according to the present invention.

FIG. 9 shows a partial cross sectional side view of wafer 101 being cut with saw blade 903 along saw path 111. In the embodiment shown, saw blade 903 is cutting both stack layer 107 and substrate 109. With this embodiment, a single saw blade (e.g. 903) may be used to cut through the whole wafer in that copper build up from the saw path has been minimized due to the removal of exposed copper in the saw path. Accordingly, the time for the singulation process may be reduced. In addition, alignment problems using multiple saw blades may be eliminated as well. However, in other embodiments, multiple saw blades may be used to cut the wafer.

Also, cracking due to saw blade 903 cutting through saw path 111 may be inhibited from propagating to die area 105 by structures 113 and 115 which serve as crack stop trenches.

After the die have been singulated, the solder of the cap (e.g. 309) is reflowed in a hydrogen furnace to form a solder ball on the copper studs (e.g. 307). In other embodiments, the solder of the caps are reflowed prior to singulation. In other embodiments, the solder of the caps are reflowed after the etching of layer 205 and prior to the removal of layer 203.

Figure 10:
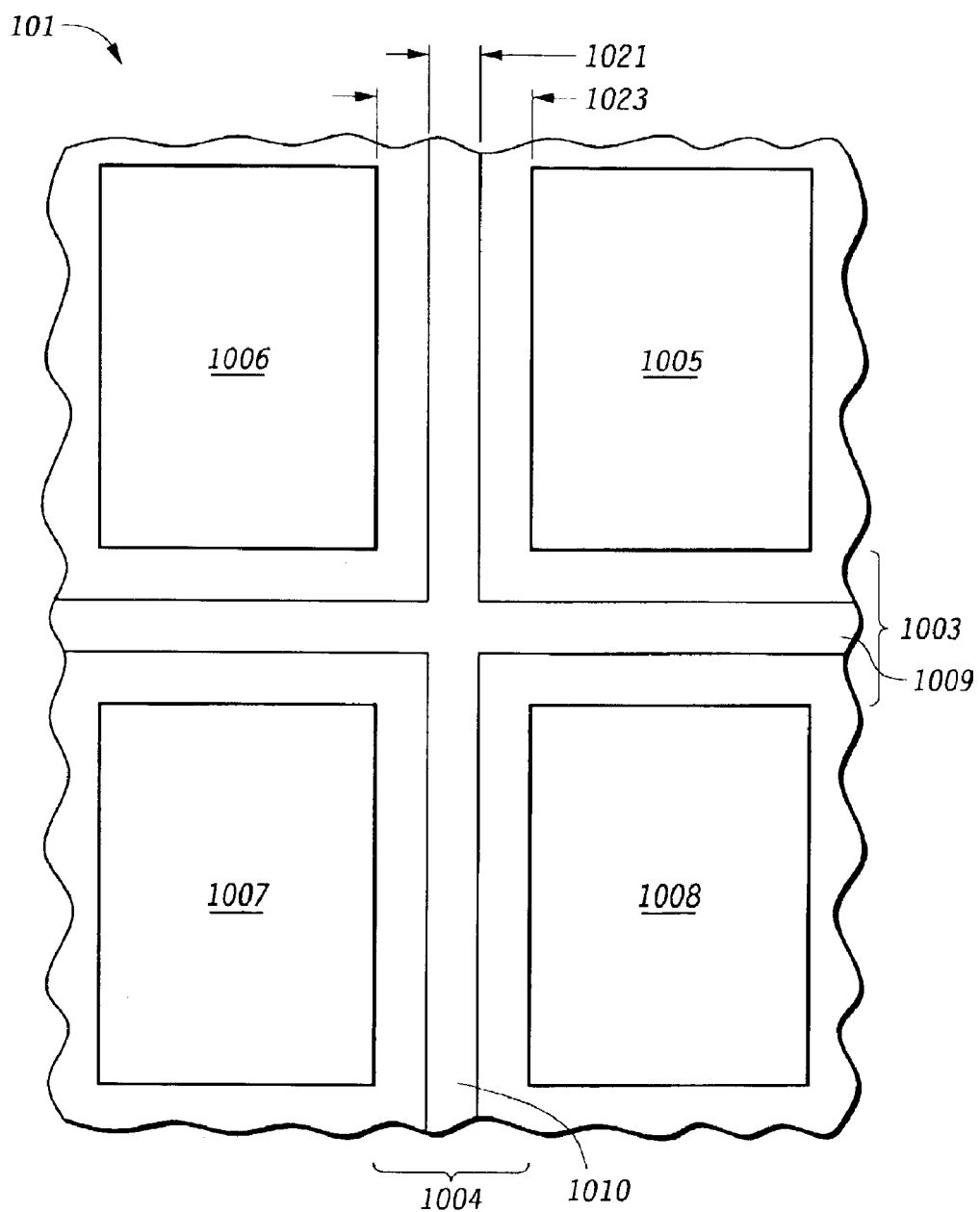
FIG. 10 is a partial top view of one embodiment of semiconductor wafer according to the present invention.

FIG. 10 shows a top portion of wafer 101. Wafer 101 includes multiple die areas with die areas 1005, 1006, 1007, and 1008 being shown in FIG. 10. Shown between the die areas are scribe areas 1003 and 1004. Located in scribe areas 1003 and 1004 are saw paths 1009 and 1010, respectively. Scribe area 1004 has a width of 1023 which in one embodiment is 100 microns. Saw path 1010 has a width of 1021, which in one embodiment is 50–55 microns. In one embodiment, the width of saw path 1010 is the width of a saw blade (e.g. 903) plus tolerances for alignment and placement. In one embodiment, those tolerances are 5 microns. To singulate die areas 1005–1008 into die, a saw blade e.g. 903 is cuts through wafer 101 along saw path 1010 and 1009.

In other embodiments, not all of the metal of conductive structures 113 and 115 and not all of the exposed metal in saw path 111 is removed prior to singulation of the die areas. For example, singulation may be performed on the wafer structure as it is shown in FIG. 7, where only the copper located in stack layers 703 and 704 (or in some embodiments, in only layer 703) is removed. In other embodiments, conductive material at some of the lower layers may be removed as well. In another example, the exposed copper in saw path 111 and the copper in conductive structures 113 and 115 at stack layers 703, 704, 705 and 706 may be removed wherein the copper in stack layers 707 and below would remain.

In other embodiments, the conductive structures of the scribe area may be made of other types of metal such as gold, silver, or aluminum. Also, the removal of metal from a scribe area may be utilized with die structures of other types and/or configurations. For example, the removal of metal from a scribe area may be utilized for a die structure with no polyimide layer 124. Also, the removal of metal from a scribe area may be utilized with die structures having other types of external conductive connection structures e.g. such as die not utilizing a solder cap (e.g. 309) where wire bonds are attached to copper studs (e.g. 307). In one embodiment, the scribe area width of a wire bond wafer can be 80 $\mu$m, where the wafer is back ground to 0.35 mm thickness, and a 30–35 $\mu$m saw blade is used for singulation. Also in other embodiments, the removal of exposed metal from a saw path may be made in die not implementing crack stop trenches 807 and 809. In other embodiments, layers 203 and 205 and stud 307 may be made of nickel.

In one aspect of the invention, a method of forming a semiconductor die includes providing a wafer. The wafer includes a substrate and a stack layer comprising a plurality of layers with interconnecting metal overlying the substrate. The stack layer comprises exposed metal at a portion of a surface of a saw path within a scribe area separating a plurality of die. Some of the exposed metal extends into the plurality of dielectric layers. The method further includes forming a dielectric passivation layer selectively overlying the stack layer and removing exposed metal at least to a first depth in a saw path of the scribe area to form recessed regions in the saw path.

In another aspect of the invention, a semiconductor wafer includes a substrate and a stack layer. The stack layer comprises a plurality of layers overlying the substrate and includes interconnect metal. The wafer includes a first die area and a second die area separated by a scribe area. The wafer further includes a dielectric passivation layer selectively overlying the stack layer and a saw path within the scribe area. The saw path has at least one recessed region in the stack layer in which metal has been removed.

In another aspect, a method of forming a semiconductor die includes providing a substrate on a wafer having multiple die areas that are physically separated by a plurality of scribe areas each having a saw path. The method also includes forming a stack layer overlying the substrate and having dielectric material and interconnecting metal. The stack layer includes exposed metal at a portion of a surface of a saw path of a scribe area of the plurality. The method further includes processing the saw path within the scribe area by etching the exposed metal to at least a first depth to form a recessed region in the saw path.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming semiconductor die comprising:
   providing a wafer, the wafer comprising a substrate and a stack layer comprising a plurality of layers with interconnecting metal overlying the substrate, the stack layer comprising exposed metal at a portion of a surface of a saw path within a scribe area separating u plurality of die, some of the exposed metal extending into the plurality of layers;
   forming a dielectric passivation layer selectively overlying the stack layer; and
   removing exposed metal at least to a first depth in a saw path of the scribe area to form recessed regions in the saw path.

2. The method of claim 1 further comprising:
   forming a continuous conductive barrier layer overlying the wafer;
   forming a continuous metal layer overlying the continuous conductive barrier layer;
   patterning photo resist over the wafer to expose areas where external contact is desired;
   forming a contact stud in the areas where external contact is desired;
   forming solder overlying the contact stud in the areas where external contact is desired;
   removing the photo resist;
   removing the continuous metal layer in all areas where there is no contact stud; and
   removing the continuous conductive barrier layer in all areas where there is no contact stud.

3. The method of claim 2 further comprising:
   while removing exposed metal in the saw path, also decreasing a circumference of the contact stud and leaving an exposed portion of the continuous conductive barrier layer adjacent the contact stud.

4. The method of claim 2 further comprising:
   forming a polyimide layer overlying the dielectric passivation layer to define areas where external contact is desired, wherein the contact stud is bounded by the polyimide layer and the polyimide layer provides stress relief.

5. The method of claim 2 further comprising:
   selecting at least one of TiW, TiN, Ta, Ni, or W as the continuous conductive barrier layer.

6. The method of claim 2 further comprising:
   forming the contact stud as a copper stud in a ball grid array (BGA) package.

7. The method of claim 2 wherein the metal of the continuous metal layer has a higher conductivity than a barrier material of the continuous conductive barrier layer.

8. The method of claim 1 wherein removing exposed metal in the saw path of the scribe area further comprises:
   removing all exposed metal in the saw path.

9. The method of claim 1 further comprising:
   sawing the wafer using a single saw blade to separate multiple die or the wafer by cutting the wafer in the saw path.

10. The method of claim 1 wherein the removing exposed metal in the saw path further comprises:
    forming open trenches in the scribe area.

11. The method of claim 1 wherein the first depth is less than a total depth of exposed metal.

12. The method of claim 1 further comprising:
    forming a contact stud overlying a predetermined portion of a conductive area of the wafer, the contact stud being formed prior to the removing exposed metal in the saw path so that some cross sectional width of the contact stud is reduced from the removing exposed metal in the saw path.

13. The method of claim 1 wherein the stack layer includes a top layer, wherein the removing exposed metal at least to a first depth includes removing exposed metal in the top layer in the saw path of the scribe area.

14. The method of claim 1 wherein:
    the stack layer includes a top layer, a via layer located below the top layer, and another layer located below the via layer;
    the another layer includes a metal structure in the saw path and electrically coupled to a metal structure of the exposed metal in the top layer in the saw path by a metal via in the via layer,
    the removing exposed metal at least to a first depth includes removing the metal structure of the exposed metal, the metal via, and the metal structure or the another layer.

15. A method of forming a semiconductor die comprising:
    providing a substrate on a wafer having multiple die areas that are physically separated by a plurality of scribe areas each having a saw path;
    forming a stack layer overlying the substrate and having dielectric material and interconnecting metal, the stack layer including exposed metal at a portion of a surface of a saw path of a scribe area of the plurality;
    processing the saw path within the scribe area by etching the exposed metal to at least a first depth to form a recessed region in the saw path.

16. The method of claim 15 wherein the stack layer includes a top layer, wherein the etching the exposed metal at least to a first depth includes removing exposed metal in the top layer in the saw path of the scribe area.

17. The method of claim 15 wherein:
    the stack layer includes a top stack layer, a via stack layer located below the top stack layer, and another stack layer located below the via stack layer;
    the another layer includes a metal structure in the saw path electrically coupled to a metal structure of the exposed metal in the top stack layer in the saw path by a metal via in the via stack layer;
    the etching the exposed metal at least to a first depth includes removing the metal structure of the exposed metal, the metal via, and the metal structure of the another layer.

18. The method of claim 15 wherein:
    the stack layer includes a top layer, a via layer located below the top layer, and another layer located below the via layer;

the another layer includes a metal structure located in the saw path and electrically coupled to a metal structure of the exposed metal in the top layer by at least a metal via in the via layer;

the etching the exposed metal at least to a first depth includes removing the metal structure of the exposed metal but not the metal structure of the another layer.

19. The method of claim 15 further comprising:

forming a contact stud on at least one of the multiple die areas prior to etching exposed metal within the saw path.

20. The method of claim 15 further comprising:

forming a continuous conductive barrier layer overlying the wafer;

forming a continuous metal layer overlying the continuous conductive barrier layer;

patterning photo resist over the wafer to expose areas where external contact is desired;

forming a contact stud in the areas where external contact is desired, the contact stud;

forming solder overlying the contact stud in the areas where external contact is desired;

removing the photo resist;

removing the continuous metal layer in all areas where there is no contact stud; and removing the continuous conductive barrier layer in all areas where there is no contact stud.

21. The method of claim 15 wherein the exposed metal comprises copper.

22. The method of claim 15 further comprising etching exposed metal in a crack stop trench in the scribe area.

23. The method of claim 1 wherein the removing exposed metal at least to a first depth in a saw path of the scribe area to form recessed regions in the saw path further includes removing metal of a via layer of the stack layer in the saw path.

24. The method of claim 15 wherein the processing the saw path within the scribe area further includes etching metal of a via layer of the stack layer in the saw path.

* * * * *

UNITED STATES PATENT AND TRADEMARK OFFICE
CERTIFICATE OF CORRECTION

| | | |
|---|---|---|
| PATENT NO. | : 6,951,801 B2 | Page 1 of 1 |
| APPLICATION NO. | : 10/351798 | |
| DATED | : October 4, 2005 | |
| INVENTOR(S) | : Scott K. Pozder | |

It is certified that error appears in the above-identified patent and that said Letters Patent is hereby corrected as shown below:

Column 8, Line 3, Claim No. 9:

Change "or" to --of--.

Signed and Sealed this

Seventeenth Day of October, 2006

JON W. DUDAS
*Director of the United States Patent and Trademark Office*